US007227179B2

(12) United States Patent
St. Lawrence et al.

(10) Patent No.: US 7,227,179 B2
(45) Date of Patent: Jun. 5, 2007

(54) CIRCUIT MATERIALS, CIRCUITS, MULTI-LAYER CIRCUITS, AND METHODS OF MANUFACTURE THEREOF

(75) Inventors: Michael E. St. Lawrence, Thompson, CT (US); Murali Sethumadhavan, Shrewsbury, MA (US); Scott D. Kennedy, Canterbury, CT (US)

(73) Assignee: World Properties, Inc., Lincolnwood, IL (US)

( * ) Notice: Subject to any disclaimer, the term of this patent is extended or adjusted under 35 U.S.C. 154(b) by 352 days.

(21) Appl. No.: 10/613,924

(22) Filed: Jul. 3, 2003

(65) Prior Publication Data

US 2004/0061105 A1 Apr. 1, 2004

Related U.S. Application Data

(60) Provisional application No. 60/415,231, filed on Sep. 30, 2002.

(51) Int. Cl.
*H01L 35/26* (2006.01)
*H01L 51/00* (2006.01)

(52) U.S. Cl. .................. 257/40; 257/632; 257/702; 428/209; 174/258; 174/257; 438/623

(58) Field of Classification Search .................. 257/29, 257/30, 40, 41, 42, 28, 33, 34, 35, 44, 39, 257/38, 45
See application file for complete search history.

(56) References Cited

U.S. PATENT DOCUMENTS 4,394,498 A 7/1983 Kastelic .................. 528/193
4,702,932 A 10/1987 Cosentino et al. ............ 427/33
4,737,398 A 4/1988 Ikenaga et al.
4,863,767 A 9/1989 Garg et al.
4,871,595 A 10/1989 Lusignea et al. .............. 428/1
4,876,120 A 10/1989 Belke et al.
4,942,095 A 7/1990 Buchert et al.
4,963,428 A 10/1990 Harvey et al.
4,966,806 A 10/1990 Lusignea et al.
4,966,807 A 10/1990 Harvey et al.

(Continued)

FOREIGN PATENT DOCUMENTS

CA 2273542 6/1999

(Continued)

OTHER PUBLICATIONS

Economy, J. et al. "LCP Polyesters Versus Thermosetting Polyesters: A Paradigm for research in the 21st Century", Macromolecular Symposia., 118, 11-22 (1997).

(Continued)

*Primary Examiner*—Leonardo Andujar
*Assistant Examiner*—Fazli Erdem
(74) *Attorney, Agent, or Firm*—Cantor Colburn LLP (57) ABSTRACT

Crosslinkable liquid crystalline polymer compositions for use as dielectric materials in circuit materials, circuits, and multi-layer circuits are disclosed. The crosslinkable liquid crystalline polymer compositions comprise crosslinkable liquid crystalline polymers that preferably comprise end groups selected from the group consisting of phenyl maleimide, nadimide, phenyl acetylene, or combinations of the foregoing. Additionally, the crosslinkable liquid crystalline polymer compositions may further comprise particulate fillers and/or fibrous webs. The crosslinkable liquid crystalline polymer compositions provided improved electrical and mechanical properties.

57 Claims, 3 Drawing Sheets

U.S. PATENT DOCUMENTS

| | | |
|---|---|---|
| 4,975,312 A | 12/1990 | Lusignea et al. |
| 5,114,612 A | 5/1992 | Benicewicz et al. |
| 5,125,138 A * | 6/1992 | Shaw et al. ............... 29/25.42 |
| 5,137,766 A | 8/1992 | Mazanek et al. ............ 428/68 |
| 5,164,458 A | 11/1992 | Jennings et al. |
| 5,176,775 A | 1/1993 | Montsinger ................ 156/181 |
| 5,194,307 A | 3/1993 | Gardeski ..................... 428/40 |
| 5,259,110 A | 11/1993 | Bross et al. |
| 5,288,529 A | 2/1994 | Harvey et al. |
| 5,315,011 A | 5/1994 | Benicewicz et al. |
| 5,360,672 A | 11/1994 | Saito et al. |
| 5,439,541 A | 8/1995 | Economy |
| 5,475,133 A | 12/1995 | Douglas et al. |
| 5,498,481 A | 3/1996 | van Ooij ................... 428/413 |
| 5,529,740 A | 6/1996 | Jester et al. |
| 5,539,031 A | 7/1996 | van Ooij ................... 524/188 |
| 5,545,475 A | 8/1996 | Korleski ................. 428/306.6 |
| 5,571,609 A * | 11/1996 | St. Lawrence et al. ..... 442/234 |
| 5,612,479 A | 3/1997 | Hefner, Jr. et al. |
| 5,703,202 A | 12/1997 | Jester et al. |
| 5,719,354 A | 2/1998 | Jester et al. |
| 5,834,072 A | 11/1998 | Schonfeld et al. ............. 428/1 |
| 5,837,160 A | 11/1998 | Dietz et al. ............ 252/299.01 |
| 5,844,036 A | 12/1998 | Hughes ...................... 524/494 |
| 5,900,292 A | 5/1999 | Moriya |
| 5,929,168 A | 7/1999 | Ikkala et al. ................ 525/132 |
| 5,997,765 A | 12/1999 | Furuta et al. |
| 6,180,025 B1 * | 1/2001 | Schoenfeld et al. ... 252/299.01 |
| 6,187,416 B1 | 2/2001 | Satoh et al. |
| 2002/0132933 A1 | 9/2002 | Dingemans et al. |

FOREIGN PATENT DOCUMENTS

| | | |
|---|---|---|
| EP | 0 184 368 | 11/1985 |
| EP | 0 502 190 | 9/1990 |
| EP | 0 697 278 | 8/1995 |
| EP | 0 740 013 A1 | 10/1996 |
| EP | 0 865 905 A2 | 9/1998 |
| EP | 0 890 615 A1 | 1/1999 |
| EP | 1 162 866 A2 | 12/2001 |
| JP | 11-309803 | 11/1999 |
| JP | 2001079946 | 3/2001 |
| WO | WO 02/22706 | 3/2002 |

OTHER PUBLICATIONS

Patrick T. Hather, et al. "Thermally crosslinkable thermotropic copolyesters: synthesis, Characterization, and processing" Polymer vol. 38 No. 24 6009-6022 (1997).

Kuraray. Press: Proceedings of the 13th JIEP Annual Meeting. Date of Issue: Mar. 3, 1999. pp. 95-96. English Translation Attached (5 pgs.).

Kuraray. Press: Electronic Surface Mounting Technology. Date of Issue: Jun. 1, 1997, vol. 7, No. 6, pp. 54-55. English translation attached (4 pgs.).

Kuraray. Press: Electronic Parts and Materials. Date of Issue: Oct. 1, 2000. vol. 39, No. 10, pp. 44-46. English Translation attached (12 pgs.).

"Rogers ZYVEX Liquid Crystalline Polymer Circuit Material", ROGERS Corporation., Advanced Circuit Materials, Data Sheet,Revision Feb. 27, 2002, 0620-0202-0.3-CC, Publication #14-019, 2 pages.

GB Search Report; GB Application No. GB0508672.3; Dated Aug. 23, 2005.

* cited by examiner

CIRCUIT MATERIALS, CIRCUITS, MULTI-LAYER CIRCUITS, AND METHODS OF MANUFACTURE THEREOF

CROSS REFERENCE TO RELATED APPLICATIONS

This application claims the benefits of U.S. Provisional Patent Application Ser. No. 60/415,231 filed Sep. 30, 2002, which is fully incorporated herein by reference.

BACKGROUND OF THE INVENTION

This disclosure relates to circuits and materials useful in the manufacture thereof, and in particular, to circuit materials comprising a thermoset liquid crystalline polymer.

As used herein, a circuit material is an article used in the manufacture of circuits, and includes circuit laminates, bond plies, cover films, and resin coated conductive layers. Circuit laminates comprise one or two conductive layers fixedly attached to a dielectric substrate, which is formed from a dielectric material. The dielectric material in a circuit laminate, bond ply, or resin coated conductive layer can comprise a thermosetting or thermoplastic polymer. The dielectric substrate in a circuit laminate generally does not soften or flow during manufacture or use of the circuit, while the dielectric material in a bond ply and resin coated conductive layer usually softens and flows during manufacture of the circuit. Dielectric materials are typically divided into two classes, flexible and rigid. Flexible dielectrics generally tend to be thinner and more bendable than the so-called rigid dielectric layers, which typically comprise a fibrous web or other forms of reinforcement, such as short or long fibers and/or fillers.

Patterning a conductive layer of a circuit laminate, for example by etching, provides a circuit layer. Multi-layer circuits comprise a plurality of conductive layers, at least one of which contains a conductive wiring pattern. Typically, multi-layer circuits are formed by laminating one or more circuit layers together using bond plies, in proper alignment, using heat and/or pressure. The bond plies are used to provide adhesion between circuits and/or between a circuit and a conductive layer that is subsequently patterned. In multi-layer structures, after lamination, known hole forming and plating technologies may be used to produce useful electrical pathways between conductive layers. A resin coated conductive layer may be bonded directly to the outer layer of a circuit. This resin coated conductive layer is sometimes referred to as a cap layer.

Electronic devices that operate at high frequencies (1 gigahertz (GHz) or higher) require use of circuit substrates with low dielectric constants and low dissipation factors. In addition, the requirements for circuit materials and circuits in high density, high performance applications require circuit materials having low dielectric constants (Dk) for low propagation delay, lower cross talk and higher clock rates, low dissipation factor (Df) for low attenuation, better signal integrity, and lower power consumption in portables. In addition, the circuit should be non-flammable, preferably achieving a rating of V-1 or better in the Underwriter's Laboratory UL-94 flammability test without the addition of halogenated flame retardants, as some of these face potential ban by the European Legislation. In addition, the circuit materials preferably have low coefficients of thermal expansion (CTE) in all directions to provide good dimensional stability and enhanced reliability, e.g., plated through-hole reliability.

Accordingly, there continues to be a need in the art for circuit materials and circuits suitable for use in high density, high performance applications. A number of crosslinked liquid crystalline polymers are known, but suffer from various drawbacks. For example, U.S. Pat. No. 5,439,541 to Economy discloses the use of cross-linked co-polyesters in circuit applications, wherein the melting point and cure temperature of the co-polyesters are relatively close in value. This proximity in melting point and cure temperature renders it difficult to produce the co-polyester in sheet form and to make partially cured laminates, which are useful for making homogeneous bond ply systems.

U.S. Pat. Nos. 5,114,612 and 5,475,133, both to Benicewicz et al., disclose the manufacture of liquid crystalline thermosets using, in the Examples, monomers that are either liquids or very brittle powders, thereby making it difficult to form sheets. These monomers also have very high exothermic curing reactions which are difficult to control, and which result in undesirable porous laminates. Additionally, as these monomers are not film forming, it is difficult to make B-staged prepregs with them.

European Patent, EP 0 697 278 B1 discloses the formation of rigid laminates from thermoplastic liquid crystalline polymers. The resulting laminates suffer from a high coefficient of thermal expansion in the Z-axis, and a low modulus and cohesive strength at high temperatures, which yields a low quality circuit board and poor bond strength at high temperatures, thereby making it difficult for the circuit board to withstand soldering and other high temperature assembly applications.

Accordingly, there continues to be a need in the art for circuit materials and circuits that meet the needs of high density, high performance applications.

SUMMARY OF THE INVENTION

The above-described drawbacks and disadvantages are alleviated by use of a crosslinkable liquid crystalline polymer composition as a dielectric material for the formation of circuit materials, circuits, and multi-layer circuits. Preferably, the crosslinkable liquid crystalline polymer comprises phenyl maleimide groups, nadimide groups, phenylacetylene groups, or a combination comprising at least one of the foregoing groups. Preferably, the groups are end groups. The crosslinkable liquid crystalline polymer composition may further comprise particulate fillers and/or a fibrous web.

Partial cure of the crosslinkable liquid crystalline polymer composition yields a B-staged crosslinkable liquid crystalline polymer, whereas complete cure of the crosslinkable liquid crystalline polymer composition yields a thermoset liquid crystalline polymer having excellent electrical and physical properties, for example dielectric constant, dissipation factor, coefficient of thermal expansion, water absorption, flame retardance, and the like. Preferably, the dielectric material formed from the crosslinkable liquid crystalline polymer composition has a dielectric constant of less than about 3.8 at frequencies higher than or equal to 1 GHz and a dissipation factor less than or equal to about 0.007. Additionally, circuit materials, circuits and multi-layer circuits comprising dielectric materials formed from the crosslinkable liquid crystalline polymer composites disclosed herein show excellent fire retardance without employing halogenated fire retardants.

The above discussed and other features and advantages of the present invention will be appreciated and understood by those skilled in the art from the following detailed description and drawings.

BRIEF DESCRIPTION OF THE DRAWINGS

Referring now to the exemplary drawings.

DETAILED DESCRIPTION OF THE PREFERRED EMBODIMENTS

Crosslinkable liquid crystalline polymer compositions may be advantageously used to provide dielectric materials useful in the formation of circuit materials, circuits, and multi-layer circuits. Crosslinkable liquid crystalline polymers are formed by providing liquid crystalline polymers with crosslinkable groups, preferably crosslinkable end groups. Examples of such groups include phenyl maleimide groups, nadimide groups, phenylacetylene groups, and combinations comprising at least one of the foregoing groups. The crosslinkable liquid crystalline polymer compositions may further comprise additional crosslinking agents co-reactive with the end groups and a crosslinking catalyst, for example a heat-initiated catalyst such as a peroxide. Other additives may also be present, for example other polymers (including thermoplastic liquid crystalline polymers), particulate fillers, fibrous webs, and the like. Cure of the crosslinkable liquid crystalline polymer materials provide thermoset liquid crystalline polymers having excellent electrical and physical properties, including flame retardancy, and may be used in either flexible or rigid circuits.

Liquid crystalline polymers are known polymers, and are sometimes described as "rigid-rod", "rod-like", or ordered polymers. Liquid crystalline polymers are believed to largely have a fixed molecular shape, e.g. linear, or the like, due to the nature of the repeating units comprising the polymeric chain, which typically comprise rigid molecular elements. The rigid molecular elements (mesogens) are frequently rod-like or disk-like in shape, and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Suitable liquid crystalline polymers are thermotropic and include liquid crystalline polyesters and liquid crystalline copolyesters, liquid crystalline polyesteramides, and liquid crystalline polyesterimides. Useful liquid crystalline polymers s also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of liquid crystalline polymers include:

(a) at least one aromatic dicarboxylic acid compound,
(b) at least one aromatic hydroxy carboxylic acid compound,
(c) at least one aromatic diol compound,
(d) at least one of an aromatic dithiol ($d_1$), an aromatic thiophenol ($d_2$), and an aromatic thiol carboxylic acid compound ($d_3$), and
(e) at least one of an aromatic hydroxyamine compound and an aromatic diamine compound.

The monomers may sometimes be used alone, but may frequently be used in a combination of monomers (a) and (c); (a) and (d); (a), (b) and (c); (a), (b), and (e) or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl) propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol.

Examples of the aromatic thiophenol ($d_2$) include 4-mercaptophenol, 3-mercaptophenol, and 6-mercapto-phenol.

Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Liquid crystalline polymers may be prepared from monomer(s) as mentioned above by a variety of esterification methods such as melt acidolysis or slurry polymerization, or the like methods. Methods for endcapping polymers with suitable reactive groups are known in the art. Suitable reactive groups for the formation of crosslinkable liquid crystalline polymers include phenyl maleimide groups, nadimide groups, phenylacetylene groups, and combinations comprising at least one of the foregoing groups. Phenyl maleimide end groups are preferred.

The crosslinkable liquid crystalline polymer composition may further comprise a thermoplastic liquid crystalline polymer. A preferred thermoplastic liquid crystalline polymer is a copolyester of 2-naphthalene carboxylic acid, 6-(acetyloxy)-polymer with 4-(acetyloxy) benzoic acid. The crosslinkable liquid crystalline polymers and thermoplastic liquid crystalline polymers are generally mixed in a weight ratio of 50:50 to 99:1, preferably in a weight ratio of 70:30 to 90:10. In addition, the crosslinkable liquid crystalline polymer composition can be blended with polymers that are not liquid crystalline polymers, hereinafter referred to as non-liquid crystalline polymers. These blends are sometimes referred to as polymer alloys. Some of these blends have processing and functional characteristics similar to liquid crystalline materials and are thus included within the scope of the terms liquid crystalline polymer. The crosslinkable liquid crystalline polymers and non-liquid crystalline polymers are generally mixed in a weight ratio of 50:50 to 99:1, preferably in a weight ratio of 70:30 to 90:10. Hereinafter the term crosslinkable liquid crystalline polymer will include the above-described blends.

The crosslinkable liquid crystalline polymer composition may further comprise a crosslinking agent reactive with the reactive groups on the polymer. Suitable cross-linking agents include, but are not limited to, azides, triallylisocyanurate, isocyanurate, divinyl benzene, sulfur, and sulfur derivatives. The cross-linking agent, when used, is typically present in an amount of about 1 to about 15 parts per hundred of the total amount of polymer.

Where advantageous, a crosslinking catalyst may also be present, for example a free-radical initiator such as a peroxide. Examples of free radical initiators include hydroperoxides, and non-peroxide initiators such as 2,3-dimethyl-2,3-diphenyl butane. Preferred peroxide cross-linking agents include dicumyl peroxide, alpha, alpha-di(t-butylperoxy)-m/p-diisopropylbenzene, 2,5-dimethyl-2,5-di(t-butylperoxy) hexane-3, and 2,5-dimethyl-2,5-di(t-butylperoxy)hexyne-3 (DYBP).

The crosslinkable liquid crystalline polymer composition may further comprise a particulate filler. Useful particulate fillers include, but are not limited to, titanium dioxide (rutile and anatase), barium titanate, strontium, titanate, silica (particles and hollow spheres) including fused amorphous silica and fumed silica; corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers may be used alone or in combination. Particularly preferred particulate fillers are rutile titanium dioxide, and amorphous silica because these fillers have a high and low dielectric constant, respectively, thereby permitting a broad range of dielectric constants combined with a low dissipation factor to be achieved in the final product by adjusting the respective amounts of the two fillers in the composition.

When used, particulate filler may be present in an amount of about 1 to about 70 weight percent (wt %) of the total weight of the composition, with less than or equal to about 60 wt % preferred, and less than or equal to about 50 wt % more preferred.

Coupling agents may be used to promote the formation of or participate in covalent bonds connecting the filler surface with a polymer. Exemplary coupling agents include 3-mercaptopropylmethyldimethoxysilane and 3-mercaptopropyltrimethoxysilane. Coupling agents, when used, may be added in the amounts of about 0.1 wt % to about 1 wt % of the total weight of the resin composition.

Where used as a substantially non-flowable dielectric material such as a dielectric substrate for a rigid circuit laminates, a fibrous web is generally incorporated into the crosslinkable liquid crystalline polymer composition. "Fibrous web" is herein defined as a woven or non-woven assemblage of fibers capable of withstanding the processing conditions involved in the formation of the dielectric material, bond ply material, circuit material, and circuit formed therefrom. Particularly useful fibrous webs may comprise materials with a melting point greater than the highest processing temperature. Exemplary fibrous webs have a melting point greater than about 250° C., with greater than or equal to about 280° C. preferred, and greater than or equal to about 300° C. more preferred. The fibrous web comprises thermally stable webs of a suitable fiber, preferably glass (E, S, and D glass) or high temperature polymer fibers (e.g., KODEL polyester from Eastman Kodak or polyphenylene sulfide fiber from Phillips Petroleum. Such thermally stable fiber reinforcement provides the composite with the desired structural rigidity. In addition, the use of the fibrous web renders a dielectric material, bond ply material, or circuit material with a relatively high mechanical strength.

Preferred examples of the fibrous web are set forth in the following Table:

| Manufacturer | Style | Thickness (inches) (micrometers) |
|---|---|---|
| Fiber Glast | 519-A | 0.0015 (38.1) |
| Hexcel-Schwebel | 1674 | 0.0045 (114.3) |
| Hexcel-Schwebel | 1080 | 0.0025 (63.5) |
| BGF | 106 | 0.0015 (38.1) |
| BGF | 7628 | 0.0069 (175.26) |

Generally, the fibrous web is present in an amount that is less than or equal to about 50 wt % of the total crosslinkable liquid crystalline polymer composition, with less than or equal to about 40 wt % preferred, and less than or equal to about 30 wt % more preferred. The amount of fibrous web is preferably greater than or equal to about 10 wt %, with greater than or equal to about 15 wt % preferred, and greater than or equal to about 20 wt % more preferred. Useful thicknesses for the fibrous web are about 25 to about 150 micrometers, with about 50 to about 100 micrometers preferred.

Exemplary conductive layers for the formation of circuit materials, circuits, and multi-layer circuits include metals such as copper, aluminum, gold, iron, nickel, stainless steel, silver, zinc, manganese, and alloys and mixtures comprising at least one of the foregoing metals. Suitable copper conductive layers include those presently used in the formation of circuits, for example, electrodeposited copper conductive layers. Useful copper conductive layers typically have thicknesses of about 9 to about 180 micrometers. Copper conductive layers can also be treated to increase surface area, treated with a stabilizer to prevent oxidation of the conductive layer (i.e., stainproofing), or treated to form a thermal barrier. Both low and high roughness copper conductive layers treated with zinc or zinc alloy thermal barriers are particularly useful, and may further optionally comprise a stain-proofing layer. Such copper conductive layers are available from, for examples, Yates Foil, USA under the trade names "TWX" and "TW", Oak- Mitsui under the tradename "TOB", Circuit Foil Luxembourg under the tradename "TWS", and Gould Electronics under the tradename "JTCS". Other suitable copper conductive layers are available from Yates Foil under the trade name "TAX"; from Circuit Foil Luxembourg under the trade name "NT TOR"; from Co-Tech Copper Foil Company under the trade name "TAX"; and from Chang Chun Petrochemical Company under the trade name "PINK".

The crosslinkable liquid crystalline polymer compositions may be processed using a variety of methods. In one exemplary method, the crosslinkable liquid crystalline polymer, optional particulate filler, and any optional components (e.g., coupling agents, silanes, etc.) may be thoroughly mixed to form an intimate blend in conventional mixing equipment, preferably in a tuna melt. The mixing temperature is regulated to avoid substantial crosslinking and/or decomposition of the components. In another embodiment, the crosslinkable liquid crystalline polymer resin is suspended or dissolved in a suitable solvent and mixed with the optional particulate filler and any other optional components (e.g., coupling agents, silanes, and the like). Suitable solvents dissolve or suspend the blend as necessary, and are readily removed, e.g., under vacuum.

Mixing continues until the components are uniformly dispersed throughout the liquid crystalline polymer resin to form a blend. The particulate filler may be pretreated with coupling agents (preferably silanes) in a separate step for more efficient use of the agents.

The blend can then be formed into a film or sheet by methods known in the art, for example by extrusion, by casting, or by powder coating onto a substrate such as release layer or a conductive layer. The sheet may then be partially crosslinked to form a B-staged composition (a prepreg) or fully crosslinked. Useful sheet thicknesses are about 25 to about 150 micrometers, with about 50 to about 100 micrometers preferred.

Alternatively, the liquid crystalline polymer blend may be directly combined with a fibrous web, or cast into a sheet and combined with a fibrous web to form a dielectric material. The methods of combining the fibrous web with the crosslinkable liquid crystalline polymer blend are various, and include but are not limited to co-extrusion, lamination, and powder coating followed by heating under pressure to a temperature effective to allow the liquid crystalline polymer to flow into the interfiber spaces of the fibrous web. For example, powders comprising the crosslinkable liquid crystalline polymer/filler blend may be coated onto a fibrous web such as a glass cloth, and then fused into the glass cloth at a temperature lower than the curing temperature. The polymer may then be partially crosslinked to form a B-staged composition (a prepreg) or fully crosslinked. The thickness of the resulting dielectric materials is preferably about 1 to about 120 millimeters.

The circuit materials, circuits, and multi-layer circuits comprising the crosslinkable liquid crystalline polymer compositions may be formed by either a continuous or a batch-wise lamination process. In a continuous lamination process, at least one of the prepregs, along with any desired optional additional layers, are arranged in a desired order to form a stack. The stack is then fed through a nip at a temperature and pressure effective to adhere the layers together. Useful nip temperatures are about 200 to about 300° C., with nip forces of about 50 to about 250 pounds per linear inch (pli). When forming a multi-layer circuit or using more than one layer of dielectric material, the layers may be laminated together sequentially. If the nip temperature is insufficient to crosslink the crosslinkable liquid crystalline polymer, the adhered layers may be crosslinked using radiation or additional heat.

When using a batch wise or semi-continuous process, at least one of the prepregs formed according to the method disclosed herein, and any desired optional additional layers used to form the circuit or multi-layer circuit are arranged in a desired order to form a stack. The stack is then placed in a press, which may or may not be evacuated to form a vacuum. The temperature is typically increased at a rate of about 2 to about 10° C./minute. Once the temperature reaches the desired lamination temperature the pressure is increased to about 2 to about 3 MegaPascal (MPa). The desired temperature depends upon the composition of the liquid crystalline polymer layer(s), particularly the dielectric substrate layer(s); however, the temperature is typically about 200° C. to about 300° C. The stack is held at the desired temperature and pressure for a time sufficient to adhere the layers, about 5 to about 45 minutes. The resulting article is then cooled while maintaining the desired pressure. The article may be removed from the press when the temperature is about 100° C. or lower, and stored until used.

It is furthermore within the scope of the present disclosure that known dielectric materials may be utilized in conjunction with the crosslinkable liquid crystalline dielectric materials disclosed herein to form circuit materials, circuits, and multi-layered circuits. Useful known dielectric materials include, for example, polybutadienes, fluoropolymers such as polytetrafluoroethylene, polyisoprenes, epoxies, cyanate esters, polyphenylene ethers, allylated polyphenylene ethers, polyesters, bismaleimide triazene (BT) resins, benzoxazines, silicones, and the like, as well as blends comprising at least one of the foregoing dielectric materials. When the crosslinkable liquid crystalline composition is used to provide a bond ply, for example, it may be used in conjunction with polybutadiene dielectric substrate materials such as RO4350B and RO4003, both available from Rogers Corporation, Rogers, Conn., and processed as described in U.S. Pat. No. 5,571,609 to St. Lawrence et al., which is herein incorporated by reference.

Although the circuit materials, circuits, and multi-layered circuits comprising the crosslinkable liquid crystalline polymer composite may comprise a variety of forms, exemplary circuit materials, circuits, and multi-layer circuits are shown in FIGS. 1–12.

Figure 1:
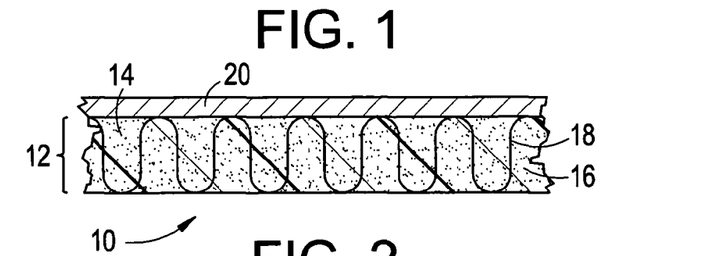
FIG. 1 is an exemplary circuit material with a dielectric layer comprising a thermoset liquid crystalline polymer, a particulate filler, and a fibrous web.

A first exemplary embodiment is shown in FIG. 1, wherein a circuit material 10 comprises a conductive layer 20 disposed on a dielectric material 12. As used herein and throughout the disclosure, "disposed" includes layers that partially or wholly cover each other. Dielectric material 12 comprises a B-staged or thermoset liquid crystalline polymer 14, a particulate filler 16, and a woven web 18. A single clad circuit laminate is provided when dielectric layer 20 is substantially non-flowable (i.e., a dielectric substrate) and a resin covered conductive layer is provided when dielectric layer 20 is flowable during circuit manufacture, e.g., during lamination. Alternatively, woven web 18 may be substituted by a non-woven assemblage (not shown).

Figure 2:
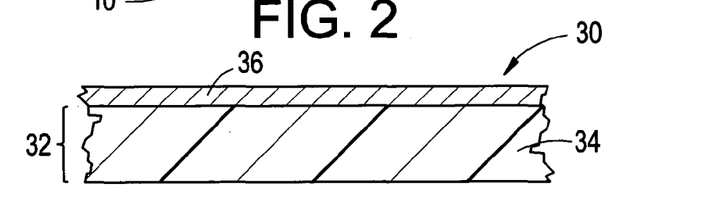
FIG. 2 is an exemplary circuit material with a dielectric layer comprising a thermoset liquid crystalline polymer.

FIG. 2 depicts an alternative embodiment, wherein a circuit material 30 comprises a dielectric layer 32 comprising a thermoset liquid crystalline polymer 34 without particulate filler or woven web. Dielectric layer 32 is disposed on a conductive layer 36. A single clad circuit laminate is provided when dielectric layer 32 is substantially non-flowable (i.e., a dielectric substrate) and a resin covered conductive layer is provided when dielectric layer 32 is flowable during circuit manufacture, e.g., during lamination. Additionally, conductive layer 36 may be in the form of a circuit layer (not shown) to form a single clad circuit (not shown).

Figure 3:
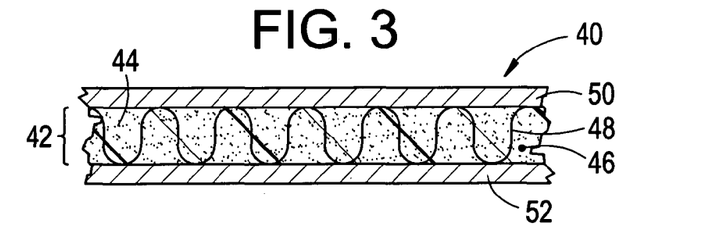
FIG. 3 shows an exemplary diclad circuit laminate having a dielectric substrate comprising a thermoset liquid crystalline polymer, a particulate filler, and a fibrous web.

Another exemplary embodiment is shown in FIG. 3, wherein a diclad circuit laminate 40 comprises a dielectric substrate 42 disposed between a conductive layer 50 and a conductive layer 52. Dielectric substrate 42 comprises a thermoset liquid crystalline polymer 44, a particulate filler 46, and a woven web 48. Alternatively, woven web 48 may be substituted by a non-woven assemblage (not shown). Additionally, one or both conductive layers 50, 52 may be in the form of a circuit layer (not shown) to form a diclad circuit (not shown).

Figure 4:
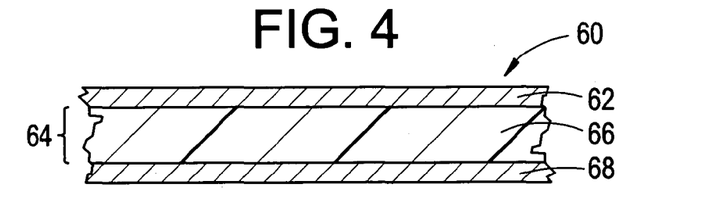
FIG. 4 shows an exemplary diclad circuit laminate having a dielectric layer comprising a thermoset liquid crystalline polymer.

FIG. 4 shows an alternative embodiment of a diclad circuit laminate 60 comprising a dielectric substrate 64 disposed between a conductive layer 62 and a conductive layer 68. Dielectric substrate 64 comprises a B-staged or thermoset liquid crystalline polymer 66 without the addition of a particulate filler or a woven web. Additionally, one or both conductive layers 62, 68 may be etched to form a circuit (not shown) resulting in a diclad circuit (not shown).

Figure 5:
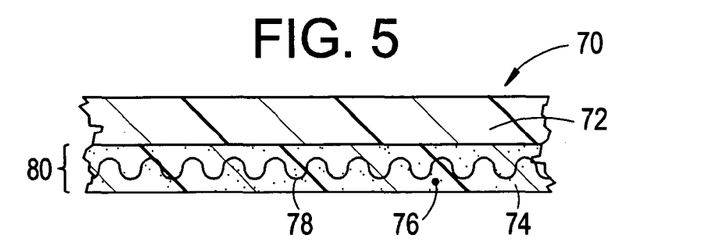
FIG. 5 is an exemplary cover film comprising a thermoset liquid crystalline polymer, a particulate filler, and a fibrous web.

FIG. 5 depicts a cover film 70 having a substantially non-flowable dielectric material 80 disposed on a flowable dielectric material 72, wherein substantially non-flowable dielectric material 80 comprises a thermoset liquid crystalline polymer 74, a particulate filler 76, and a woven web 78. Alternatively, woven web 78 may be substituted by a non-woven assemblage (not shown).

Figure 6:
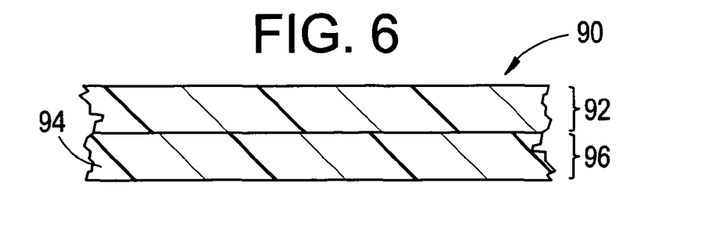
FIG. 6 is an exemplary cover film comprising a thermoset liquid crystalline polymer.

FIG. 6 depicts a cover film 90 comprising a flowable dielectric material 92 disposed on a substantially non-flowable dielectric material 96, wherein substantially non-flowable dielectric material 96 comprises a thermoset liquid crystalline polymer 94 without the addition of particulate filler or a woven web. It is contemplated that flowable dielectric material 72 and flowable dielectric material 92 may also comprise a crosslinkable liquid crystalline polymer composition as described in the present disclosure. It is also contemplated that where flowable dielectric materials 72 and 92 comprise a crosslinkable liquid crystalline polymer composition, substantially non-flowable dielectric materials 80 and 96 may or may not comprise a crosslinkable liquid crystalline polymer composition.

Figure 7:
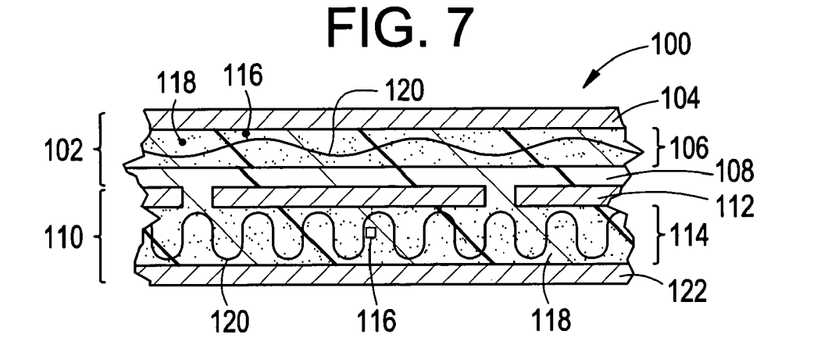
FIG. 7 is an exemplary multi-layer circuit having a dielectric layer and a dielectric substrate comprising a thermoset liquid crystalline polymer, a particulate filler, and a fibrous web.

Another exemplary embodiment is shown in FIG. 7. FIG. 7 depicts a multi-layer circuit 100 comprising a resin coated conductive layer 102 disposed on a diclad circuit 110. Resin coated conductive layer 102 comprises a substantially non-flowable dielectric material 106 disposed between a conductive layer 104 and a flowable dielectric material 108. Diclad circuit 110 comprises a dielectric substrate 114 disposed between a circuit layer 112 and a conductive layer 122. Dielectric substrate 114 includes a thermoset liquid crystalline polymer 116, a particulate filter 118, and a woven web 120. Alternatively, woven web 120 may be substituted by a non-woven assemblage (not shown). Flowable dielectric material 108 is disposed on a side of circuit layer 112 opposite to dielectric substrate 114. Flowable dielectric material 108 comprises a dielectric material that preferably does not contain any additives that would hinder flow. Additionally, substantially non-flowable dielectric material 106 comprises thermoset liquid crystalline polymer 116, particulate filler 118, and woven web 120 in amounts that may be less than, equal to (not shown), or greater than (not shown) the amounts used in dielectric substrate 114. Woven web 120 may be absent (not shown), or substituted for a non-woven assemblage (not shown).

Figure 8:
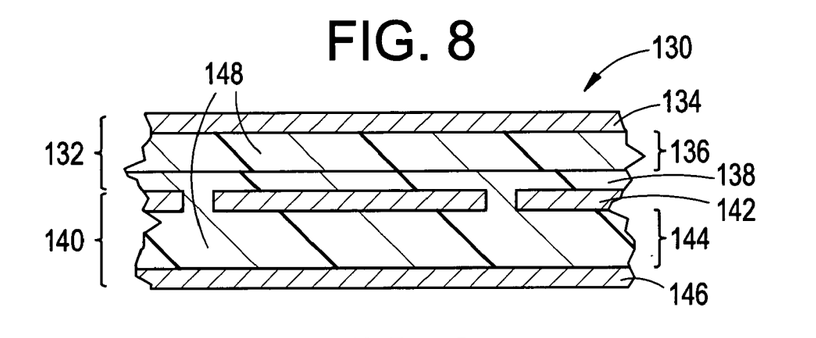
FIG. 8 is an exemplary multi-layer circuit having a dielectric layer and a dielectric substrate comprising a thermoset liquid crystalline polymer.

FIG. 8 depicts an alternative embodiment of a multi-layer circuit 130 comprising a resin coated conductive layer 132 disposed on a diclad circuit 140. Resin coated conductive layer 132 comprises a substantially non-flowable dielectric material 136 disposed between a conductive layer 134 and a flowable dielectric material 138. Diclad circuit 140 comprises a dielectric substrate 144 disposed between a circuit layer 142 and a conductive layer 146. At least one of substantially non-flowable dielectric material 136, flowable dielectric material 138, and/or dielectric substrate 144 comprises a thermoset liquid crystalline polymer 148.

Figure 9:
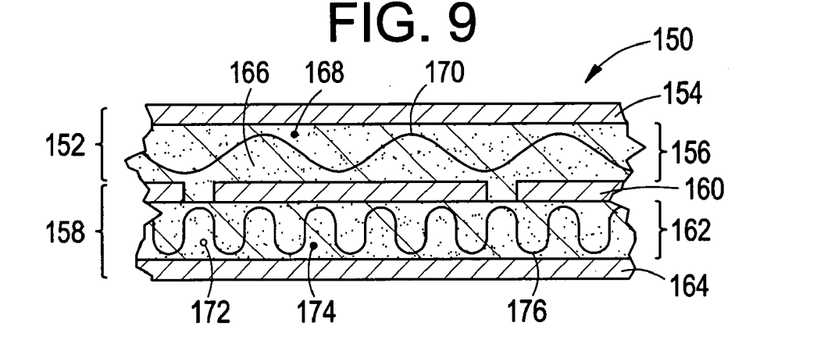
FIG. 9 is an exemplary multi-layer circuit having a dielectric layer and a dielectric substrate comprising a thermoset liquid crystalline polymer, a particulate filler, and a fibrous web.

FIG. 9 depicts a multi-layer circuit 150 comprising an alternative embodiment of a resin coated conductive layer 152. Here, resin coated conductive layer 152 comprises a conductive layer 154 disposed on a flowable dielectric material 156. Flowable dielectric material 156 is disposed on a circuit layer 160 of a diclad circuit 158 on a side of circuit layer 160 opposite to a dielectric substrate layer 162. Dielectric substrate layer 162 is disposed on a conductive layer 164. In this embodiment, flowable dielectric material 156 comprises less, including none of (not shown) of a particulate filler 168, and/or a woven web 170 (or non-woven assemblage (not shown)) as does dielectric substrate 162. At least one of flowable dielectric material 156 and/or dielectric substrate 162 comprises a thermoset liquid crystalline polymer.

Figure 10:
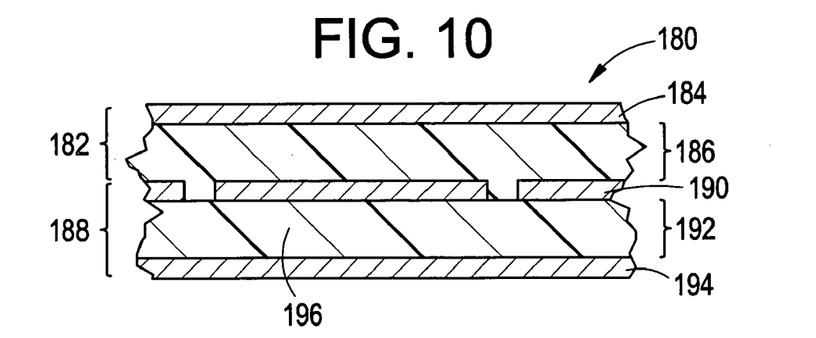
FIG. 10 is an exemplary multi-layer circuit having a dielectric layer and a dielectric substrate comprising a thermoset liquid crystalline polymer.

FIG. 10 depicts a multi-layer circuit 180 comprising a resin coated conductive layer 182 disposed on a diclad circuit 188. Resin coated conductive layer 182 includes a conductive layer 184 disposed on a flowable dielectric material 186. Diclad circuit 188 comprises a dielectric substrate 192 disposed between a circuit layer 190 and a conductive layer 194. At least one of flowable dielectric material 186 and/or dielectric substrate 192 comprises a thermoset liquid crystalline polymer. One or both of flowable dielectric material 186 and/or dielectric substrate 192 may comprise a particulate filler with or without a fibrous web.

Figure 11:
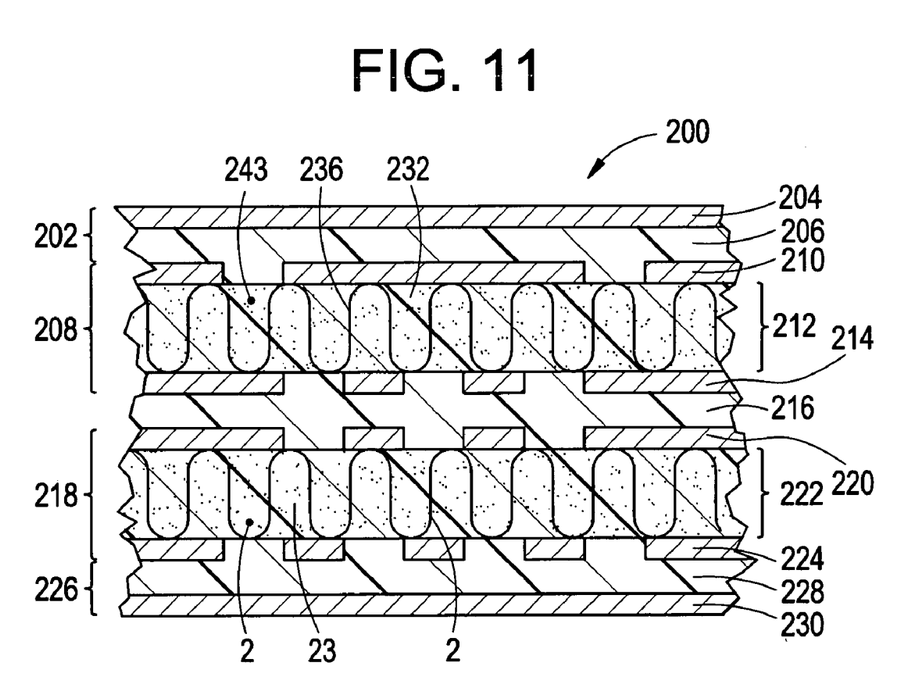
FIG. 11 is an exemplary multi-layer circuit having two dielectric substrate layers comprising a thermoset liquid crystalline polymer, a particulate filler, and a fibrous web.

FIG. 11 depicts another exemplary embodiment of a multi-layer circuit 200 comprising a bond ply 216 disposed between a first diclad circuit 208 and a second diclad circuit 218. Each of diclad circuit 208, 218 comprises a dielectric substrate 212, 222 respectively, disposed between circuit layers 210, 220, respectively, and circuit layers 214, 224, respectively. Additionally, a resin coated conductive layer 202 comprising a conductive layer 204 disposed on a flowable dielectric material 206 is disposed on circuit layer 210 of diclad circuit 208. A resin coated conductive layer 226, comprising a flowable dielectric material 228 disposed on a conductive layer 230 is disposed on circuit layer 224. A substantially non-flowable dielectric material (not shown) may be disposed between conductive layer 204 and flowable dielectric material 206 and/or between conductive layer 230 and flowable dielectric material 228. Dielectric substrate layer 212 comprises a thermoset liquid crystalline polymer 232, a particulate filler 234, and a woven web 236, and dielectric substrate layer 222 comprises a thermoset liquid crystalline polymer 235, a particulate filler 237, and a woven web 239. Fibrous webs 236, 239 may each be substituted by a non-woven assemblage (not shown). Alternatively, one or more of the other dielectric materials, i.e., flowable dielectric material 206, flowable dielectric material 228, and bond ply 216, may comprise the thermoset liquid crystalline polymer composition as disclosed herein.

Figure 12:
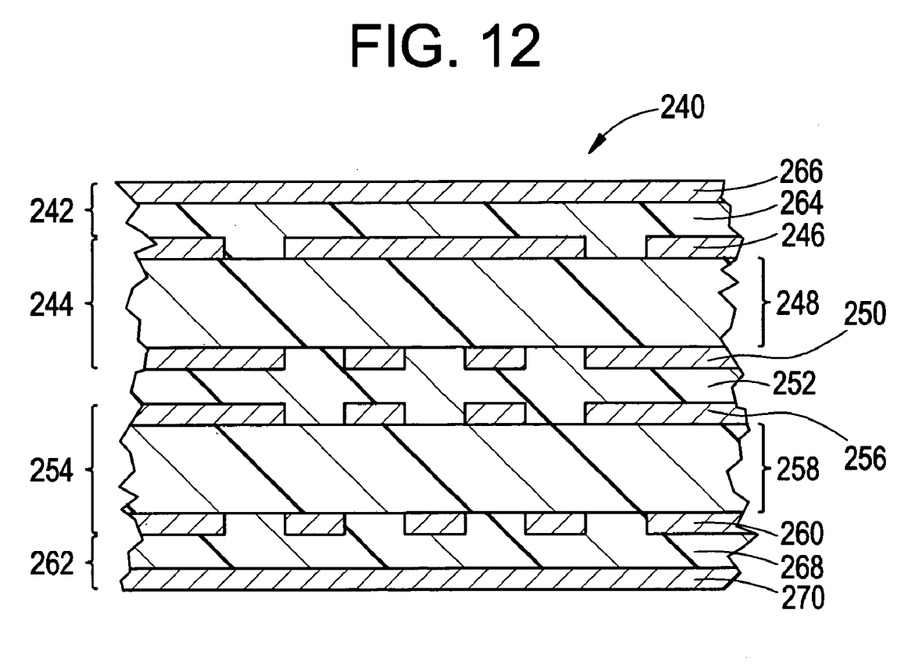
FIG. 12 is an exemplary multi-layer circuit having two dielectric substrate layers comprising a thermoset liquid crystalline polymer.

FIG. 12 depicts a multi-layer circuit 240 comprising a resin coated conductive layer 242 disposed on a first diclad circuit 244, wherein diclad circuit 244 comprises a dielectric substrate 248 disposed between a first circuit layer 246 and a second circuit layer 250. A bond ply 252 is disposed between first diclad circuit 244 and a second diclad circuit 254, wherein diclad circuit 254 comprises a dielectric substrate 258 disposed between a third circuit layer 256 and a fourth circuit layer 260. Diclad circuit 254 is disposed between bond ply 252 and a resin coated conductive layer 262. Resin coated conductive layers 242 and 262 comprise a flowable dielectric material 264, 268, respectively, disposed on a conductive layer 270, respectively. At least one of dielectric substrates 248, 258, bond ply 252, and/or dielectric materials 264, 268 comprise a thermoset liquid crystalline polymer. At least one of dielectric substrates 248, 258, bond ply 252, and/or dielectric materials 264, 268 may further comprise a particulate filler and/or a fibrous web.

Use of a crosslinkable liquid crystalline polymer composition as described herein in the formation of circuit materials, circuits, and multi-layer circuits offers numerous advantages. For example, the thermoset liquid crystalline polymer materials exhibit desirable dielectric constants and dielectric loss factors, wherein the cured circuit material, circuit, or multi-layer circuit has a dielectric constant of less than about 3.8 and a dissipation factor of less than about 0.007, each measured at frequencies from 1 to 10 gigahertz. The circuit materials, circuits, and multi-layer circuits also have low moisture absorption and low flammability. In particular, they do not require halogen based fire retardants to achieve a V-1 or better rating measured in accordance with UL-94.

Additionally, the liquid crystalline polymer materials preferably have an X-Y coefficient of thermal expansion (CTE) that is substantially the same as the X-Y CTE of the conductive layer. Substantially the same is herein defined as varying by less than about 20%, preferably by less than about 15%. The similarity in the X-Y CTE of the conductive layer and the thermoset liquid crystalline polymer results in less strain between the thermoset liquid crystalline polymer and the conductive layer and increases the strength of the bond between the thermoset liquid crystalline polymer and the conductive layer.

The materials also have advantageous processing characteristics. They have generally lower processing temperatures and wider processing temperature windows than thermoplastic liquid crystalline polymers and certain of the above-described crosslinked liquid crystalline polymers. In particular, there is at least 20° C., preferably at least 30° C., and more preferably at least about 50° C. between the melt temperature and the cure temperature, which allows ready formation into sheets and incorporation with fibrous webs, for example. They also have a wider viscosity range, a glass transition temperature (Tg) greater than or equal to about 180° C., preferably greater than or equal to about 200° C., and excellent adhesion to conductive layers and dielectric layers, particularly dielectric layers comprising thermoplastic or thermoset liquid crystalline polymers.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A circuit material for the formation of circuits or multi-layer circuits, the circuit material comprising:
    a first conductive layer; and
    a dielectric layer disposed on the first conductive layer, wherein the dielectric layer comprises a crosslinkable liquid crystalline polymer comprising phenyl maleimide groups, nadimide groups, phenylacetylene groups, or a combination comprising at least one of the foregoing groups; and further comprises a particulate filler, a fibrous web, or a combination comprising at least one of the foregoing, wherein the dielectric layer has a dielectric constant of less than about 3.8, a dissipation factor of less than or equal to about 0.007 when measured from 1 to 10 GHz, and a UL-94 rating of V-1 or better, when the liquid crystalline polymer composition is fully crosslinked.

2. The circuit material of claim 1, wherein the conductive layer is copper.

3. The circuit material of claim 1, wherein the dielectric layer is substantially nonflowable when fully crosslinked.

4. The circuit material of claim 1, wherein dielectric layer is flowable when partially crosslinked.

5. The circuit material of claim 1, further comprising a second conductive layer disposed on the dielectric layer on a side opposite the first conductive layer.

6. The circuit material of claim 1, wherein the crosslinkable liquid crystalline polymer comprises phenyl maleimide groups.

7. A circuit laminate for the formation of circuits or multi-layer circuits, the circuit laminate comprising:
    a first conductive layer; and
    a dielectric substrate disposed on the first conductive layer, wherein the dielectric substrate comprises a B-staged or thermoset liquid crystalline polymer having crosslinked groups derived from phenyl maleimide groups, nadimide groups, phenylacetylene groups, or a combination comprising at least one of the foregoing groups; and further comprises a particulate filler, a fibrous web, or a combination comprising at least one of the foregoing, wherein the dielectric substrate has a dielectric constant of less than about 3.8, a dissipation factor of less than or equal to about 0.007 when measured at 1 to 10 GHz, and a UL-94 rating of V-1 or better when fully crosslinked.

8. The circuit laminate of claim 7, wherein the conductive layer is copper.

9. A method of forming a circuit material, comprising contacting a crosslinkable liquid crystalline polymer composition with a conductive layer, wherein the crosslinkable liquid crystalline polymer composition comprises a crosslinkable liquid crystalline polymer comprising phenyl maleimide groups, nadimide groups, phenylacetylene groups, or a combination comprising at least one of the foregoing groups; and further comprises a particulate filler, a fibrous web, or a combination comprising at least one of the foregoing; and crosslinking the crosslinkable liquid crystalline polymer to form a B-staged or thermoset liquid crystalline polymer dielectric material, wherein the fully crosslinked composition has a dielectric constant of less than about 3.8, a dissipation factor of less than or equal to about 0.007 when measured from 1 to 10 GHz, and a UL-94 rating of V-1 or better.

10. A circuit comprising:
a dielectric substrate comprising a thermoset liquid crystalline polymer having crosslinked phenyl maleimide groups, nadimide groups, phenylacetylene groups, or a combination comprising at least one of the foregoing groups; and further comprising a particulate filler, a fibrous web, or a combination comprising at least one of the foregoing; and
a first conductive circuit layer disposed on the dielectric substrate, wherein the dielectric substrate has a dielectric constant of less than about 3.8, a dissipation factor of less than or equal to about 0.007 when measured from 1 to 10 GHz, and a UL-94 rating of V-1 or better.

11. The circuit of claim 10, wherein the conductive layer is copper.

12. A multi-layer circuit comprising:
a resin coated conductive layer comprising a first conductive layer disposed on a flowable dielectric material; and
a diclad circuit, comprising a dielectric substrate disposed between a circuit layer and a second conductive layer, wherein the flowable dielectric material is disposed on a side of the circuit layer opposite the dielectric substrate, and further wherein
the flowable dielectric material, the dielectric substrate, or both, comprises a thermoset liquid crystalline polymer having crosslinked phenyl maleimide groups, nadimide groups, phenylacetylene groups, or a combination comprising at least one of the foregoing groups;
wherein the multilayer circuit has a dielectric constant of less than about 3.8, a dissipation factor of less than or equal to about 0.007, and a UL-94 rating of V-1 or better.

13. The multi-layer circuit of claim 12, wherein the first conductive layer, second conductive layer, and circuit layer are copper.

14. The multilayer circuit of claim 12, wherein the dielectric substrate further comprises a particulate filler, a fibrous web, or a combination comprising at least one of the foregoing.

15. A multi-layer circuit comprising:
a first diclad circuit comprising a first dielectric substrate disposed between a first circuit layer and a second circuit layer;
a second diclad circuit comprising a second dielectric substrate disposed between a third circuit layer and a fourth circuit layer; and
a bond ply disposed between the second circuit layer on a side opposite the first dielectric substrate layer, and the third circuit layer on a side opposite the second dielectric layer, wherein at least one of the first dielectric substrate, the second dielectric substrate, or the bond ply comprises a B-staged or thermoset liquid crystalline polymer having crosslinked phenyl maleimide groups, nadimide groups, phenylacetylene groups, or a combination comprising at least one of the foregoing groups;
wherein the multi-layer circuit has a dielectric, constant of less than about 3.8, a dissipation factor of less than or equal to about 0.007, and a UL-94 rating of V-1 or better.

16. The multilayer circuit of claim 15, wherein at least one of the first dielectric substrate, the second dielectric substrate, or the bond ply further comprises a particulate filler, a fibrous web, or a combination comprising at least one of the foregoing.

17. The multilayer circuit of claim 15, further comprising a cover film disposed on the first circuit layer on a side opposite the first dielectric layer, wherein the cover film comprises a thermoset liquid crystalline polymer formed by the crosslinking of phenyl maleimide groups, nadimide groups, phenylacetylene groups, or a combination comprising at least one of the foregoing groups.

18. A B-staged circuit material for the formation of circuits or multi-layer circuits, the circuit material comprising:
a first conductive layer; and
a dielectric layer disposed on the first conductive layer, wherein the dielectric layer comprises a liquid crystalline polymer comprising phenyl maleimide groups, nadimide groups, phenylacetylene groups, or a combination comprising at least one of the foregoing groups, wherein the groups have been partially crosslinked; and further comprises a particulate filler, a fibrous web, or a combination comprising at least one of the foregoing; and further wherein the fully crosslinked liquid crystalline polymer has a dielectric constant of less than about 3.8, a dissipation factor of less than or equal to about 0.007 when measured from 1 to 10 GHz, and a UL-94 rating of V-1 or better.

19. The B-staged circuit material of claim 18, wherein the conductive layer is copper.

20. A circuit material for the formation of circuits or multi-layer circuits, the circuit material comprising:
a first conductive layer; and
a dielectric layer disposed on the first conductive layer, wherein the dielectric layer comprises a liquid crystalline polymer comprising phenyl maleimide groups, nadimide groups, phenylacetylene groups, or a combination comprising at least one of the foregoing groups, and further wherein said groups crosslink at a temperature that is at least about 20° C. greater than the melt temperature of the liquid crystalline polymer.

21. The circuit material of claim 20, wherein the conductive layer is copper.

22. The circuit material of claim 20, wherein the dielectric layer is substantially nonflowable when fully crosslinked.

23. The circuit material of claim 20, wherein the dielectric layer is flowable when partially crosslinked.

24. The circuit material of claim 20, further comprising a second conductive layer disposed on the dielectric layer on a side opposite the first conductive layer.

25. The circuit material of claim 20, wherein the dielectric layer further comprises a particulate filler, a fibrous web, or a combination comprising at least one of the foregoing.

26. The circuit material of claim 20, wherein the liquid crystalline polymer comprises phenyl maleimide groups.

27. The circuit material of claim 20, having a dielectric constant of less than about 3.8, a dissipation factor of less than or equal to about 0.007 when measured from 1 to 10 GHz, and a UL-94 rating of V-1 or better, when the liquid crystalline polymer composition is fully crosslinked.

28. The circuit laminate of claim 7, further comprising a second conductive layer disposed on the dielectric substrate on a side opposite the first conductive layer.

29. The circuit laminate of claim 7, wherein the B-staged or thermoset liquid crystalline polymer comprises crosslinked groups derived from phenyl maleimide groups.

30. The method of claim 9, wherein the conductive layer is copper.

31. The method of claim 9, wherein the crosslinkable liquid crystalline polymer is substantially nonflowable when fully crosslinked.

32. The method of claim 9, wherein the crosslinkable liquid crystalline polymer is flowable when partially crosslinked.

33. The method of claim 9, further comprising contacting the crosslinkable liquid crystalline polymer composition with a second conductive layer on a side opposite the first conductive layer and crosslinking the crosslinkable liquid crystalline polymer to form a B-staged or thermoset liquid crystalline polymer dielectric material.

34. The method of claim 9, wherein the crosslinkable liquid crystalline polymer comprises phenyl maleimide groups.

35. The circuit of claim 10, further comprising a second conductive layer disposed on the dielectric substrate on a side opposite the first conductive layer.

36. The circuit of claim 10, wherein the thermoset liquid crystalline polymer comprises crosslinked phenyl maleimide groups.

37. The multi-layer circuit of claim 10, wherein the thermoset liquid crystalline polymer comprises crosslinked phenyl maleimide groups.

38. The multi-layer circuit of claim 15, wherein the first circuit layer, the second circuit layer, the third circuit layer, and the fourth circuit layer are copper.

39. The multi-layer circuit of claim 15, wherein the B-staged or thermoset liquid crystalline polymer comprises crosslinked phenyl maleimide groups.

40. The B-staged circuit material of claim 18, wherein the dielectric layer is substantially nonflowable when fully crosslinked.

41. The B-staged circuit material of claim 18, wherein the dielectric layer is flowable when partially crosslinked.

42. The B-staged circuit material of claim 18, further comprising a second conductive layer disposed on the dielectric layer on a side opposite the first conductive layer.

43. The B-staged circuit material of claim 18, wherein the liquid crystalline polymer comprises phenyl maleimide groups.

44. A circuit material comprising:
a first conductive layer; and
a dielectric layer disposed on the first conductive layer, wherein the dielectric layer comprises a crosslinkable liquid crystalline polymer comprising phenyl maleimide groups, nadimide groups, phenylacetylene groups, or a combination comprising at least one of the foregoing groups, wherein the circuit material has a dielectric constant of less than about 3.8, a dissipation factor of less than or equal to about 0.007 when measured from 1 to 10 GHz, and a UL-94 rating of V-1 or better, when the liquid crystalline polymer composition is fully crosslinked.

45. The circuit material of claim 44, wherein the conductive layer is copper.

46. The circuit material of claim 44, wherein the dielectric layer is substantially nonflowable when fully crosslinked.

47. The circuit material of claim 44, wherein the dielectric layer is flowable when partially crosslinked.

48. The circuit material of claim 44, further comprising a second conductive layer disposed on the dielectric layer on a side opposite the first conductive layer.

49. The circuit material of claim 44, wherein the crosslinkable liquid crystalline polymer comprises phenyl maleimide groups.

50. A circuit laminate comprising:
a first conductive layer; and
a dielectric substrate disposed on the first conductive layer, wherein the dielectric substrate comprises a B-staged or thermoset liquid crystalline polymer having crosslinked groups derived from phenyl maleimide groups, nadimide groups, phenylacetylene groups, or a combination comprising at least one of the foregoing groups, wherein the circuit laminate has a dielectric constant of less than about 3.8, a dissipation factor of less than or equal to about 0.007 when measured at 1 to 10 GHz, and a UL-94 rating of V-1 or better when fully crosslinked.

51. The circuit laminate of claim 50, wherein the conductive layer is copper.

52. The circuit laminate of claim 50, further comprising a second conductive layer disposed on the dielectric substrate on a side opposite the first conductive layer.

53. The circuit laminate of claim 50, wherein the thermoset liquid crystalline polymer comprises crosslinked groups derived from phenyl maleimide groups.

54. A circuit comprising:
a dielectric substrate comprising a thermoset liquid crystalline polymer having crosslinked phenyl maleimide groups, nadimide groups, phenylacetylene groups, or a combination comprising at least one of the foregoing groups; and
a first conductive circuit layer disposed on the dielectric substrate;
wherein the circuit has a dielectric constant of less than about 3.8, a dissipation factor of less than or equal to about 0.007 when measured from 1 to 10 GHz, and a UL-94 rating of V-1 or better.

55. The circuit of claim 54, wherein the conductive layer is copper.

56. The circuit of claim 54, further comprising a second conductive circuit layer disposed on the dielectric substrate on a side opposite the first conductive circuit layer.

57. The circuit of claim 54, wherein the thermoset liquid crystalline polymer comprises crosslinked phenyl maleimide groups.

* * * * *